United States Patent [19]

Sue et al.

[11] Patent Number: 5,242,753
[45] Date of Patent: Sep. 7, 1993

[54] SUBSTOICHIOMETRIC ZIRCONIUM NITRIDE COATING

[75] Inventors: Jiinjen A. Sue, Carmel; Harden H. Troue, Plainfield, both of Ind.

[73] Assignee: Praxair S.T. Technology, Inc., Danbury, Conn.

[21] Appl. No.: 728,338

[22] Filed: Jul. 11, 1991

[51] Int. Cl.$^5$ .............................. B32B 15/04
[52] U.S. Cl. .................. 428/336; 106/286.4; 428/332; 428/698; 428/704
[58] Field of Search .......... 428/698, 336, 332, 704; 106/286.4

[56] References Cited

U.S. PATENT DOCUMENTS

| | | | |
|---|---|---|---|
| 3,900,592 | 8/1975 | Kennedy et al. | 428/212 |
| 4,428,811 | 1/1984 | Sproul et al. | 204/192.15 |
| 4,774,151 | 9/1988 | Cuomo et al. | 428/698 |
| 4,839,245 | 6/1989 | Sue et al. | 428/469 |
| 4,895,765 | 1/1990 | Sue | 428/627 |
| 4,981,756 | 1/1991 | Rhandhawa | 428/698 |
| 5,071,693 | 10/1991 | Sue et al. | 428/698 |

FOREIGN PATENT DOCUMENTS 2135337  8/1984  United Kingdom.

OTHER PUBLICATIONS

Thin Solid Films, 107(1983) pp. 141–147 "Very High Rate Reactive of TiN, ZrN and HfN*".
Surface and Coatings Technology, 33(1987) pp. 133–139 "Turning Tests of High Rate Reactively Sputter-Coated T-15 HSS Inserts*", Paper presented at the International Conference on Metallurgical Coatings, San Diego, CA, USA, Apr. 18–20, 1983 and Mar. 23–27, 1987, respectively.
Surface and Coatings Technology, 33(1987) pp. 53–62 "Zirconium Nitride Films Prepared By Cathodic Arc Plasma Deposition Process*." presented at the 14th International Conference on Metallurgical Coatings, San Diego, CA, U.S.A., Mar. 23–27, 1987.
Surface and Coating Technology, 33(1987) 117–132 "Comparision of Cutting Performance of Ion-Plated NbN, ZrN, TiN and (Ti, Al)N" Coatings presented at the 14th International Conference on Metallurgical Coatings, San Diego, CA, U.S.A., Mar. 23–27, 1987.
Surface and Coatings Technology, 39/40(1989) pp. 421–434 "Influence of Crystallographic Orientation, Residual Strains, Crystallite Size and Microhardness on Erosion in ZrN Coatings," J. A. Sue and H. H. Troue.
J. Vac Science Technology A6(3) (1988) pp. 2158–2161 "Structure and Composition of ZrN and (Ti, Al)N coatings".
Thin Solid Films, 153(1987) pp. 19–36 "High Temperature Microhardness of Hard Coatings Produced by Physical and Chemical Vapor Deposition", presented at the 14th International Conference on Metallurgical Coatings, SD, CA, USA Mar. 23–27, 1987.
Thin Solid Films, 145 (1986) pp. 81–88 "A Comparative Study of the Diffusion Barrier Properties of TiN and ZrN, M. Ostling, S. Nygren," C. S. Petersson, H. Norstrom, R. Buchta, H. O. Blom and S. Berg.
Vac Science Technology, A5(1987) pp. 2184–2189 "A study of nitrogen rich titanium and zirconium nitride films", E. O. Ristolainen, J. M. Molarius, A. S. Korhonen, and V. K. Lindroos.
Thin Solid Films, 171(1989) 197–216 "Residual Stress in Physically Vapor Deposited Films A Study of Deviations From Elastic Behavior", A. J. Perry and M. Jagner.
Surface And Coatings Technology, 36(1988) pp. 715–727 "Composition and Properties of Transition Metal Nitride Thin Films ($Zrn_x, NbN_x, MoN_x$)", H. A. Jehn presented at the 15th International Conference on Metallurgical Coatings, San Diego, CA, U.S.A., Apr. 11–15, 1988.
Surface And Coatings Technology, 36 (1988) pp. 766–780 "Influence of Residual Compressive Stress on Erosion Behavior of Arc Evaporation Titanium Nitride Coating", J. A. Sue and H. H. Troue, presented at the 15th International Conference on Metallurgical Coatings, San Diego, CA, USA, Apr. 11–15, 1988.
Journal Of Materials Science 18(1983) pp. 766–780 "Effect of Material Parameters on the Erosion Resistance of Brittle Materials", S. M. Wiederhorn, B. J. Hockey.

*Primary Examiner*—A. A. Turner
*Attorney, Agent, or Firm*—Cornelius F. O'Brien

[57] ABSTRACT

A wear and erosion resistant coating for substrates which comprises a substoichiometric zirconium nitride coating having a nitrogen content in the zirconium nitride coating from 41 to 48 atomic weight percent.

8 Claims, 7 Drawing Sheets

SUBSTOICHIOMETRIC ZIRCONIUM NITRIDE COATING

FIELD OF THE INVENTION

The invention relates to a wear and erosion resistant coating composed of substoichiometric zirconium nitride in which the nitrogen content of the coating is from 41 to 48 atomic weight percent.

BACKGROUND OF THE INVENTION

Resistance against erosion wear is normally related to the hardness of the wear part. Some articles are subject to solid particle erosion in which particles of various sizes and hardness are propelled at various angles against the surface of the articles. For example, a car traveling in the desert during a wind storm will encounter various size solid particles of sand traveling at various velocities hitting the car. If the size of the particles is large and the velocity of the particles is high, the coating on the car could be chipped or pitted. In turbomachines which operate in a dust environment, this solid particle erosion is a severe problem. Recently, physical and chemical vapor deposited coatings, such as titanium nitride coatings and zirconium nitride coatings, have been used to provide a protective layer having good hardness characteristics. These coatings have been found to have good erosion resistance to $Al_2O_3$ and $SiO_2$ particles at both high and low impact angles. Although these coatings have high hardness characteristics, they exhibit inherently brittle behavior and their erosion resistance at normal impact decreases markedly with increasing hardness and particle size of the erodent. It has been observed that dynamic impact of solid particle erodents onto a coated surface of an article can form lateral and/or median cracks around the impact site. Median cracks are responsible for the strength degradation of the material while lateral cracks, which grow from the center of impact parallel to the substrate surface and then propagate through the coating surface, account for most of the material loss during solid particle impact erosion. The solid particle impact erosion of these coatings at a 90° impact angle is due primarily to brittle fracture. Thin coatings are more susceptible to spalling and exposure of the substrate which may lead to premature failure of the article. When coatings applied by conventional techniques are exposed to particle impact, pinholes and/or lateral spalling pits generally result in the coating. Once the coating material is cracked, additional impact by even relatively small particles will cause furrowing or grooves in the coating material. In a turbomachine, this furrowing can greatly affect the overall performance of the turbomachine.

Based on the elastic-plastic theory, toughness and hardness are the dominant properties controlling the erosion behavior. Higher hardness is believed to increase erosion resistance at both low and high impingement angles while higher toughness reduces the vulnerability to brittle fracture and markedly increases 90° erosion resistance. An erosion resistant coating needs to be simultaneously hard and tough. However, hardness and toughness are generally in opposition in hard materials. Higher hardness is usually associated with greater brittleness. Multilayer hard compound materials have been found to have simultaneously high hardness and high toughness. The high hardness is an inherent property of hard compounds and the high toughness is attributed to the formation of a coherent or partly coherent interface boundary between two different hard compound layers. In ceramic materials, hardness and toughness are typically maximized by a fine-grained microstructure. In copending application U.S. Ser. No. 07/728,339 now U.S. Pat. No. 5,185,211 filed concurrently herewith, titled Non-Stoichiometric Titanium Nitride Coating, wear and erosion resistant coatings are disclosed which compromise non-stoichiometric titanium nitride.

In copending application U.S. Ser. No. 405,131 now abandoned, a multilayer coating is disclosed which has good wear and erosion resistant characteristics, such multilayer coating comprising alternate lamellas layers of a nitride-containing compound in which at least one layer contains at least 2 atomic percent of nitrogen different than the nitrogen contained in an adjacent layer.

Prior art references disclose that the erosion resistance of zirconium nitride coatings increased with decreasing crystallite size and that superstoichiometric $ZnN_{1.13}$ (53 atomic percent of nitrogen) coatings had good wear characteristics.

It is an object of the present invention to provide a substoichiometric zirconium nitride coating that has good wear resistance and/or erosion characteristics to solid particle impact.

Another object of the present invention is to provide a substrate with a substoichiometric zirconium nitride coating in which the atomic percent of nitrogen in the nitrogen is between 41% and 48%.

The above and further objects and advantages of this invention will become apparent upon consideration of the following description.

SUMMARY OF THE INVENTION

The invention relates to a substoichiometric zirconium nitride coating for substrates in which the atomic percent of nitrogen in the coating is from 41% to 48%. Preferably, the atomic percent of nitrogen in the substoichiometric zirconium nitride coating could be from 42% to 45% and most preferably about 43% to 44%. The coating of this invention has good wear and corrosion characteristics and should have a crystallize size, measured in the direction perpendicular to (111) diffraction plane, of between about 12 to 24 nm, preferably between about 13 to 20 nm.

A method for producing a substoichiometric zirconium nitride coating on a substrate comprising the steps:

(a) placing a substrate in a chamber containing a zirconium-based target and a nitrogen-containing gas mixture;

(b) evaporating the zirconium from the zirconium-based target to produce a zirconium vapor to react with the nitrogen in the nitrogen-containing gas mixture and adjusting the ratio of nitrogen to zirconium to form a zirconium nitride layer on the substrate that has a nitrogen content from 41 atomic percent to 48 atomic percent.

One preferred embodiment for producing a zirconium nitride coating on a substrate would comprise the steps:

(a) placing a substrate in a vapor deposition chamber having an anode and containing a zirconium-based cathode along with a nitrogen-containing gas mixture;

(b) applying a voltage across the cathode and anode to establish a current to effect evaporation of the zirconium from the zirconium-based cathode to produce a zirconium vapor to react with the nitrogen in the nitrogen-containing gas mixture and;

(c) adjusting the ratio of nitrogen to zirconium to form a zirconium nitride layer on the substrate that has a nitrogen content from 41 atomic percent to 48 atomic percent.

It is believed that the simultaneous coating of a substrate with a $ZrN_x$ based composition and bombardment of the substrate with inert gas ions, such as argon ions, will produce small crystallite for the substoichiometric coating of this invention. As used herein, a substoichiometric coating of zirconium nitride shall mean a coating in which the nitrogen content is below 50 atomic percent.

Preferably, the nitrogen-containing gas mixture could be argon-nitrogen; krypton-nitrogen; helium-nitrogen; xenon-nitrogen; neon-nitrogen or the like. The zirconium nitride coating of this invention can be deposited by using conventional physical vapor deposition techniques such as arc processes, dc and rf magnetron sputtering, reactive ion plating and the like.

Preferably, the substrate could have a zirconium-containing outer surface so that the coating can form a strong bond to the substrate. The zirconium-containing outer layer should preferably be from 0.1 to 6.0 microns thick, and more preferably from 0.2 to 4.0 microns thick.

The thickness of the zirconium nitride coating of this invention can vary greatly as for example between 1 to 40 microns thick while for wear applications the preferred thickness of the coating could be between 1 to 10 microns and for erosion applications the coating could be 8 to 40 microns.

The zirconium nitride coating of this invention is ideally suited for coating substrates such as titanium, iron, aluminum, nickel, cobalt and alloys thereof. In some applications, the substrate could be coated with a zirconium-containing layer prior to depositing the coating of this invention since the undercoat will effectively provide a better adherence for the coating.

EXAMPLE 1

Figure 1:
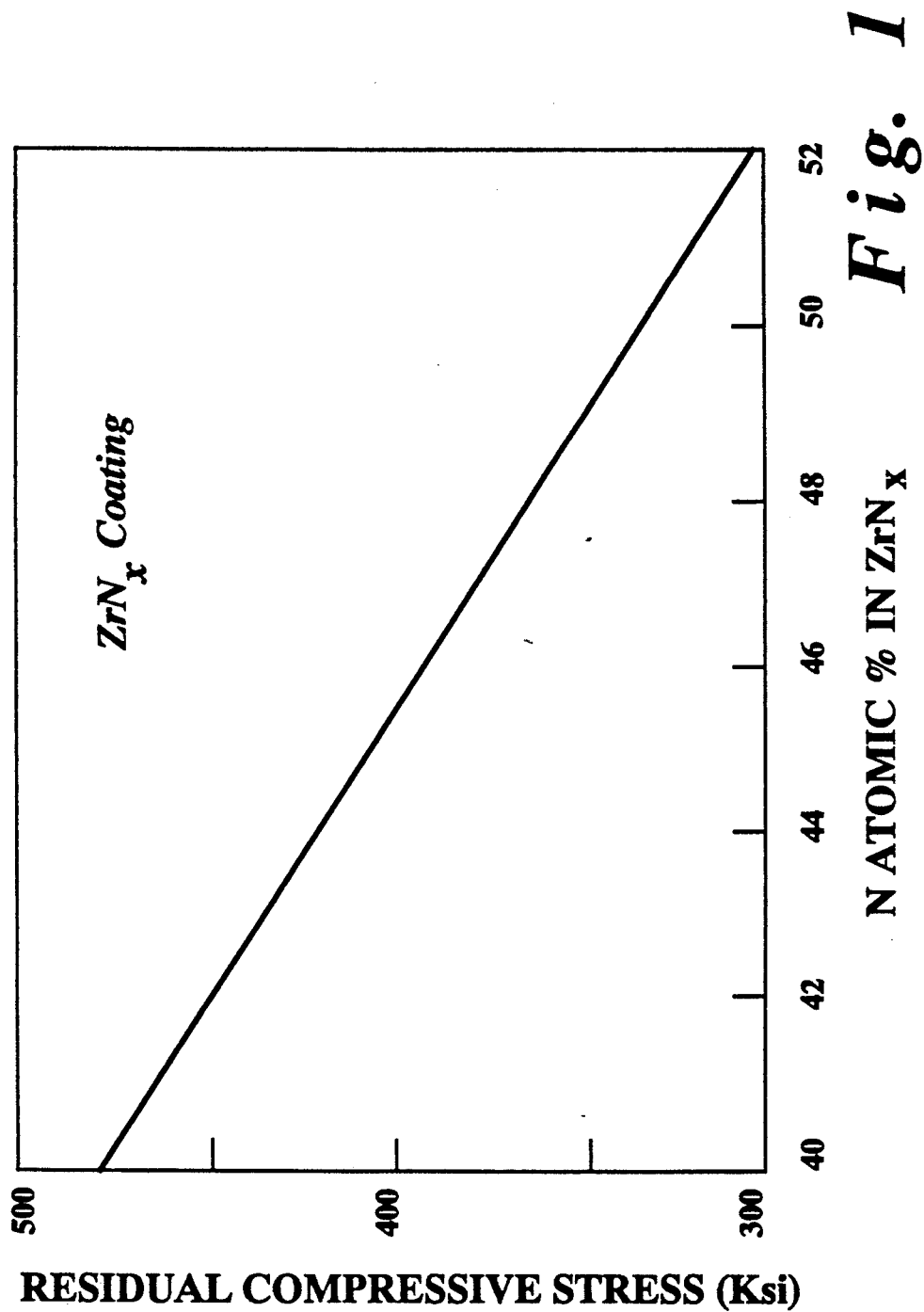
FIG. 1 is a plot of residual compressive stress vs. nitrogen content for the coating of this invention.

Zirconium nitride coatings were deposited on titanium alloy substrates using a physical vapor deposition arc evaporation process. Before deposition, the vapor deposition chamber was evacuated to a pressure below $7 \times 10^{-4}$ Pa and then backfilled with argon to 0.7 Pa. The substrates to be coated were sputter-cleaned with a negative bias of 1 Kvdc for between 30 to 60 minutes to remove surface contaminants. Subsequently, a 200 to 350 ampere d.c. arc was activated across a zirconium cathode and a chamber which acts as an anode to evaporate zirconium from the zirconium cathode in an argon and nitrogen environment at an overall pressure about 4 Pa. The ionized zirconium vapor reacted with $N_2$ ions and then formed a zirconium nitride coating on the substrate. Each coating was formed by adjusting the nitrogen gas flow rates during the deposition. Specifically the nitrogen gas flow was varied from approximately 70 to 90 standard cubic centimeters per minute (sccm) and the total argon gas flow was maintained at about 240 sccm. The deposition temperature, determined using an optical pyrometer, was between 410° C. and 520° C.

The nitrogen content of each sample coating was measured by sputtered mass neutral spectrometry. The neutral atoms of the coating were sputtered from its surface into plasma by ions which were generated from a low pressure r.f. plasma. The neutral atoms were then ionized by energetic electron impact. These ions were subsequently analyzed and detected in a quadrupole mass spectrometer. The measured area was in an 8 mm diameter circle and the total sputtered depth was approximately 5 microns.

The nitrogen content of each sample coating is shown in the Table.

TABLE

COMPARISON OF MATERIAL AND STRUCTURAL PROPERTIES OF SUBSTOICHIOMETRIC AND STOICHIOMETRIC NITRIDE COATINGS

| Coating | N Content (at. %) | Crystallite Size $D_{111}$ (nm) | Microhardness (Kgf mm$^{-2}$) | Residual Compressive Stress (Ksi) | Relative Erosion 90° | Resistance 20° |
|---|---|---|---|---|---|---|
| I | 40.5 | 10.6 | 2318 ± 64 | 466 ± 13 | 0.6 | 0.4 |
| II | 43.2 | 14.7 | 2588 ± 52 | 424 ± 29 | 3.1 | 3.2 |
| III | 44.3 | 12.5 | 2566 ± 76 | 434 ± 26 | 2.1 | 3.0 |
| IV | 47.2 | 26.1 | 2273 ± 45 | 330 ± 15 | 1.8 | 1.3 |
| V | 47.8 | 23.5 | 2219 ± 58 | 353 ± 25 | 2.1 | 1.8 |
| VI | 49.1 | 26.3 | 2167 ± 53 | 344 ± 18 | 1.7 | 1.4 |
| VII | 50.0 | 32.5 | 2037 ± 40 | 315 ± 29 | 1.0 | 1.0 |

The crystallite size of each of the sample coatings was determined by the Scherrer formula as follows:

$$D_{hkl} = \frac{K\lambda}{\beta \cos\theta}$$

Where $D_{hkl}$ is the dimension of crystallite in the direction perpendicular to the reflecting plan (hkl), K is the crystallite shape factor which is assumed to be 1 in this case, $\lambda$ is the wavelength of the X-rays, $\theta$ is the glancing angle of incidence, and $\beta$ is the half-maximum breadth. Typically, the experimentally observed breadth ($\beta$) is comprised of B due to the particle size effect and b resulting from the instrumental broadening, $\beta = B + b$. The instrumental broadening, b, was determined using ZrN powder with particle size greater than several microns. The crystallite size $D_{III}$ was determined and the results are shown in the Table. This data shows that the crystallite size $D_{III}$ decreased with decreasing nitrogen content as from 32.5 nm at 50 atomic percent nitrogen to 10.6 nm at 40.5 atomic percent nitrogen.

Residual stresses of the sample $ZrN_x$ coatings were determined using the standard $\sin^2\psi$ method based on the change in lattice spacings (strain).

The stresses of $ZrN_x$ sample coatings were then measured with the assumption of Youndis modulus of $40.6 \times 10^6$ psi and a poisson rate of 0.25.

Residual compressive stress was found in all the $ZrN_x$ sample coatings and the data are shown in the Table. The magnitude of compressive stress appeared to increase linearly with decreasing nitrogen content.

The as-coated surface of each of the $ZrN_x$ sample coatings was metallographically polished before being subjected to microhardness measurements, using a Vickers hardness tester with a load of 0.1 Kg for 15 seconds. The data obtained is presented in the Table and shows that the microhardness of $ZrN_x$ increased with decreasing nitrogen content from 2037 kilograms force per square millimeter (Kgf mm$^{-2}$) at 50 atomic percent N to a maximum of 2588 Kgf mm$^{-2}$ at 43.2 atomic percent N, and then decreased to 2318 Kgf mm$^{-2}$ at 40.5 atomic percent N.

The $ZrN_x$ sample coatings were exposed to 50 microns alumina erosion at both 20° and 90° impingement angles at room temperature. Compressed air with a pressure of 290 Kpa (42 psig) was used to deliver alumina particles through a 5 mm diameter alumina nozzle. The nozzle-to-specimen distance was maintained at 10 cm. The amount of alumina particles used for 20° and 90° erosion was 1800 g and 400 g, respectively. The relative erosion resistance was calculated by comparing the total weight loss of the substoichiometric $ZrN_x$ coatings with that of a stoichiometric ZrN coating, in which the erosion resistance was assumed to be 1 at both 20° and 90° impact angles. The data obtained is presented in the Table and shows that a maximum erosion resistance at 20° and 90° occurred at about 42 to 45 atomic percent N, which corresponds to the region having the combination of maximum microhardness and minimun grain size.

DRAWINGS

FIG. 1 shows a plot of residual compressive stress versus nitrogen content for several sample coatings of this invention.

Figure 2:
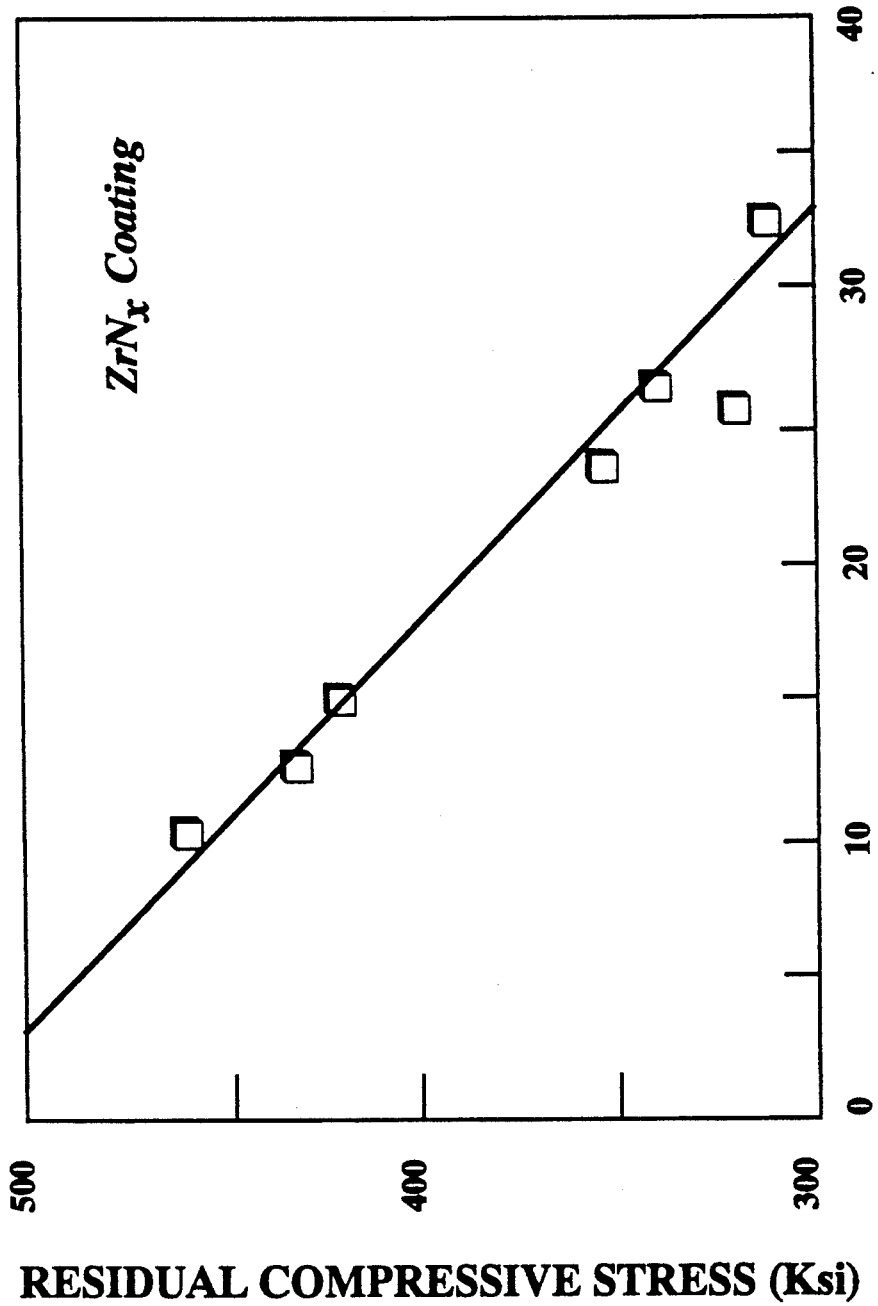
FIG. 2 is a plot of residual compression vs. crystallite size in $ZrN_x$ coatings.

FIG. 2 shows a plot of crystallite size vs. residual compressive stress for sample coatings of this invention.

Figure 3:
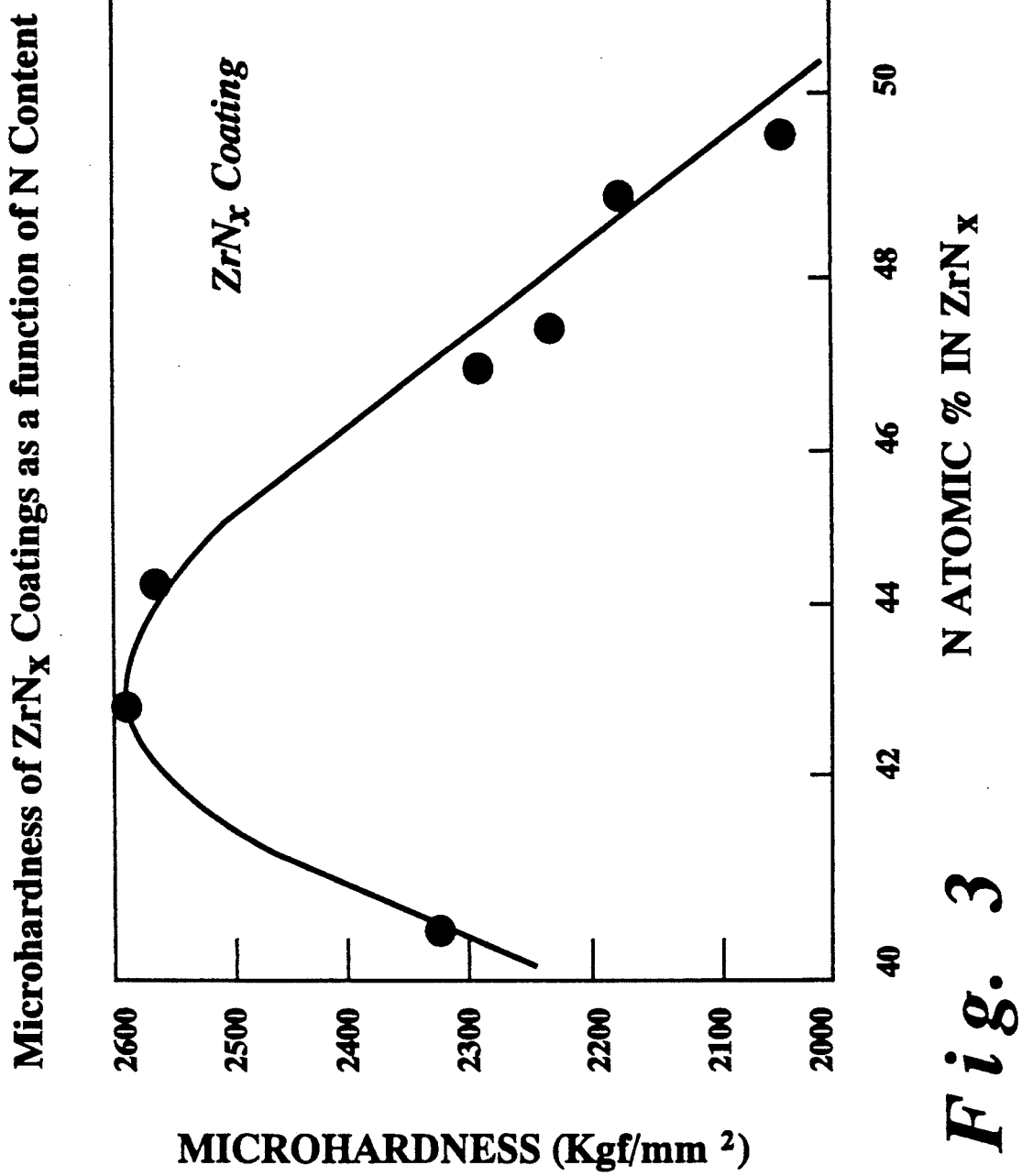
FIG. 3 is a plot of microhardness vs. the nitrogen content in $ZrN_x$ coatings.

FIG. 3 shows a plot of microhardness vs. nitrogen content for sample coatings of this invention.

Figure 4:
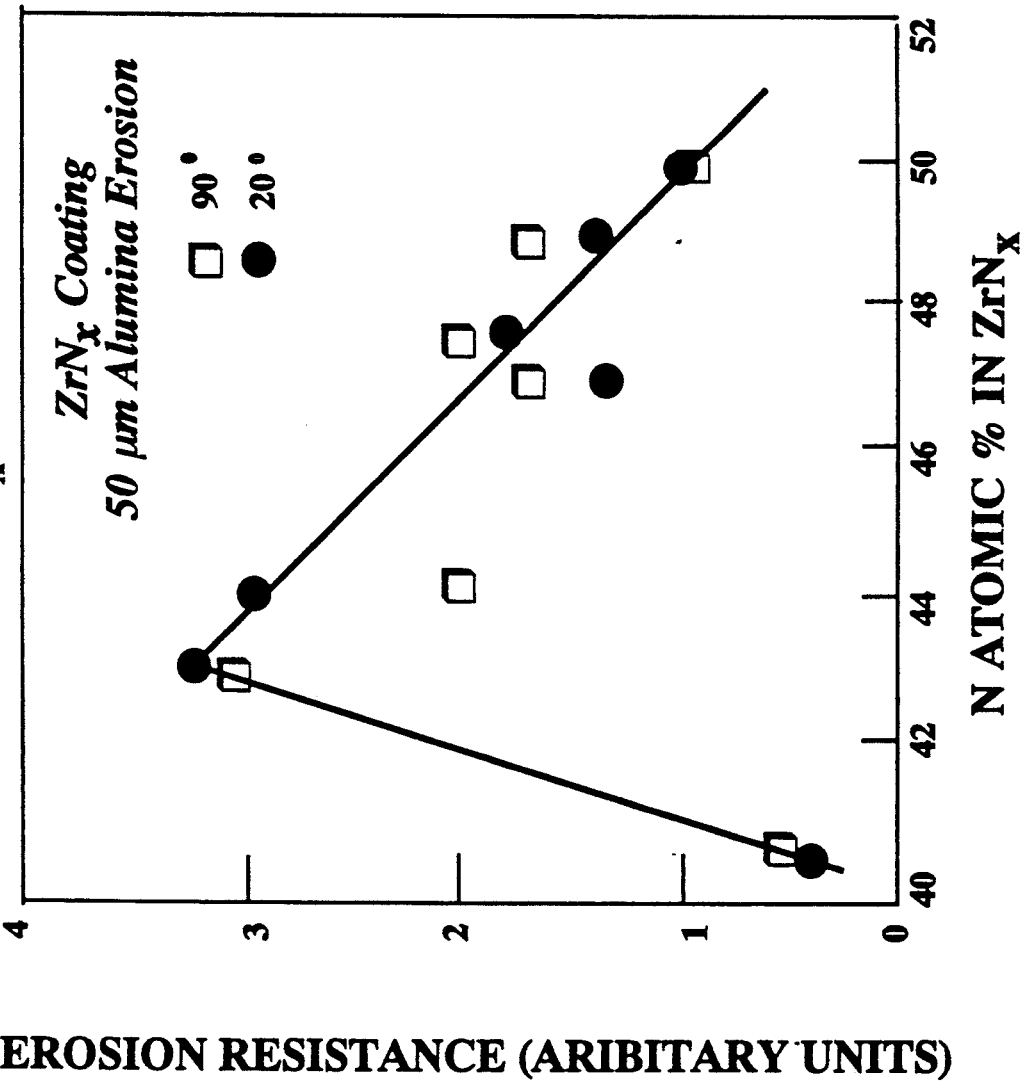
FIG. 4 is a plot of erosion resistance vs. the nitrogen content for various $ZrN_x$ coatings.

FIG. 4 shows a plot of erosion resistance vs. nitrogen content in sample coatings of this invention.

Figure 5:
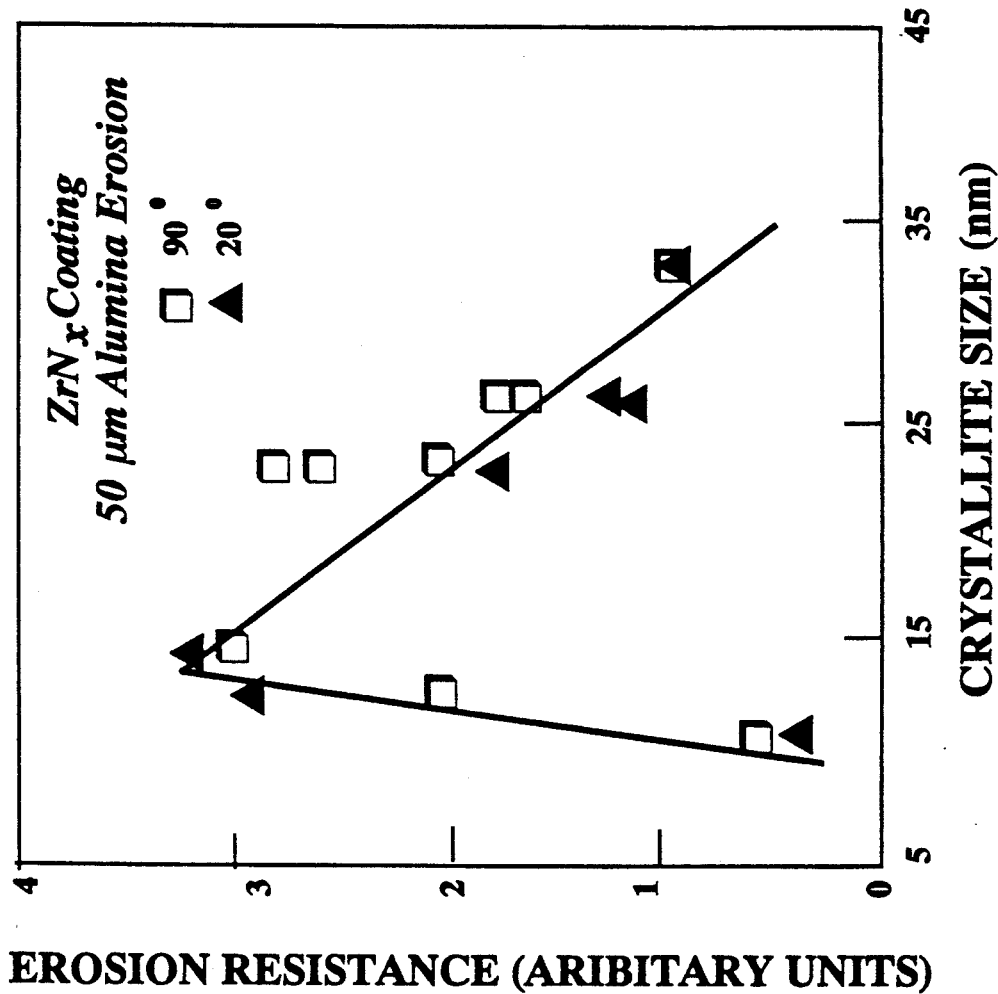
FIG. 5 is a plot of erosion resistance vs. crystallite size in $ZrN_x$ coatings.

FIG. 5 shows a plot of erosion resistance vs. crystallite size for sample coatings of this invention.

Figure 6:
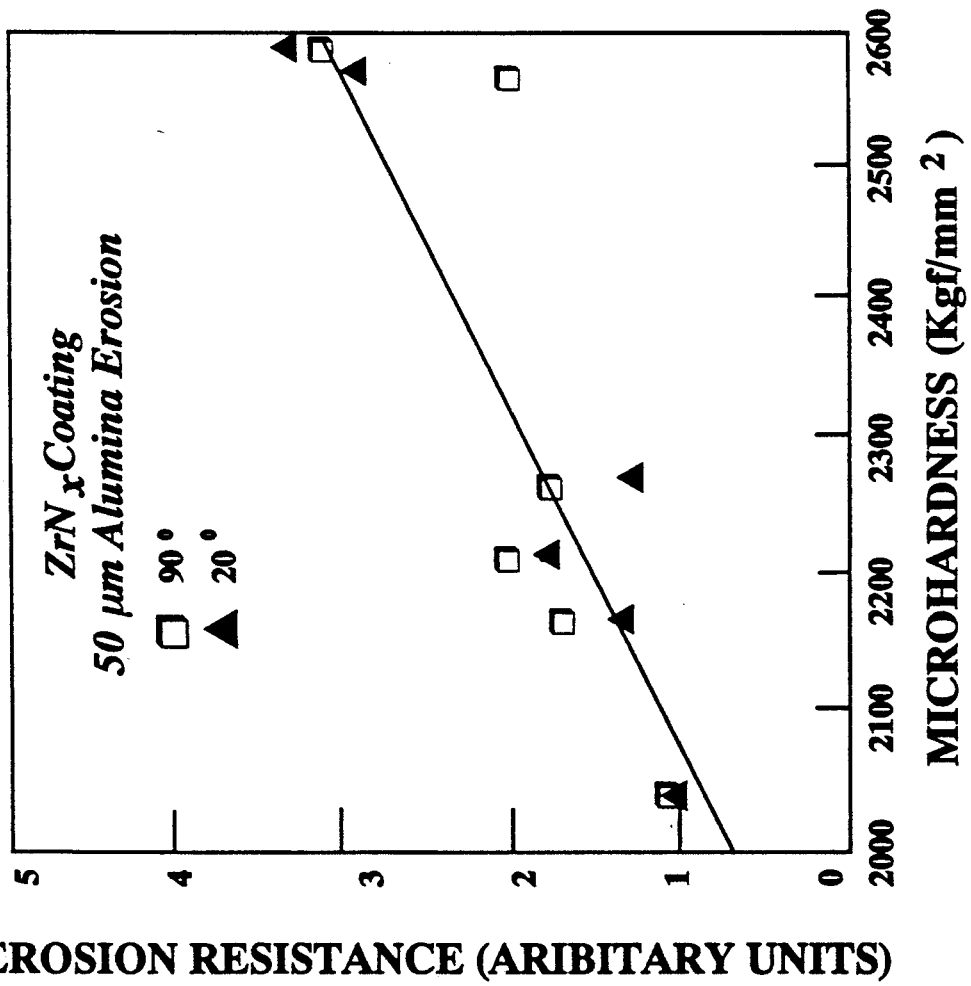
FIG. 6 is a plot of erosion resistance vs. microhardness in $ZrN_x$ coatings.

FIG. 6 shows a plot of erosion resistance vs. microhardness for sample coatings of this invention.

Figure 7:
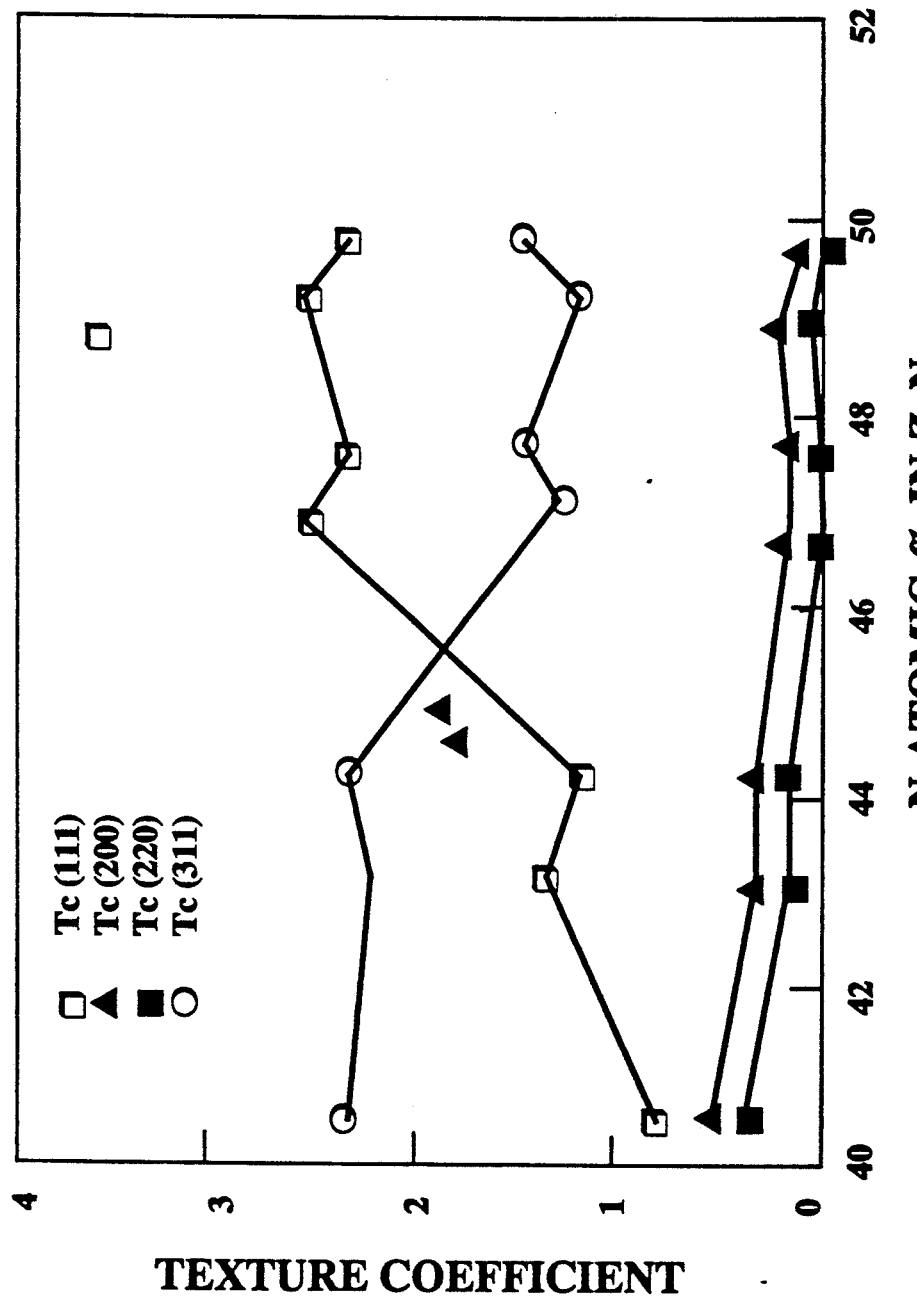
FIG. 7 is a plot of texture coefficient vs. the nitrogen content for various $ZrN_x$ coatings.

FIG. 7 shows a plot of the texture coefficient as a function of N concentration in several sample coatings of this invention.

A plot of residual compressive stress versus nitrogen content was plotted in FIG. 1 for the sample coating from the Table and the data demonstrates that the residual comprehensive stress of substoichiometric $ZrN_x$ coatings decreased linearly with increasing nitrogen content.

FIG. 2 shows a plot of crystallite size v. residual compressive stress. The smaller crystallite size is believed to more than compensate for the increased stress. In FIG. 3 a plot of microhardness vs. nitrogen content shows that a maximum microhardness occurs between 42 and 45 atomic percent N content. FIG. 4 shows a plot of erosion resistance vs. nitrogen content in which a maximum erosion resistance appears at N content between 42 and 44 atomic percent. FIG. 5 shows a plot of erosion resistance vs. crystallite size in which the optimum crystallite size is shown around 15 nm.

FIG. 6 shows a plot of erosion resistance vs. microhardness in which the erosion resistance increases with increasing microhardness.

FIG. 7 shows that the texture coefficient is a function of N concentration in the coating. The coating exhibited a combination of <111> and <311> preferred orientation at N content between 41.5 and 48 atomic percent. The most preferred coating has a combination of <111> and <311> preferred orientation in which <311> preferred L orientation is dominant over <111> preferred orientation.

In the substoichiometric ZrN coating system, microhardness and crystallite size are believed to be the predominant parameters controlling erosion behavior in which the erosion resistance increases with increasing microhardness and with decreasing crystallite size. A linear relationship between erosion resistance and microhardness can only be obtained, if we exclude the coating containing 40.5 atomic percent nitrogen (FIG. 6). The erosion resistance, increased with decreasing crystallite size down to 12 nm (FIG. 5). At crystallite size significantly less than 12 nm, when the nitrogen is about 40.5 atomic percent, a marked decrease in erosion resistance was observed.

An anomoly occurring in the variation of erosion with material and structural parameters was primarily linked to the coating containing 40.5 atomic percent nitrogen. This coating had microhardness 2318 Kgf mm$^{-2}$, crystallite size 10 nm, macrostrain 0.75%, and residual compressive stress 466 Ksi. Based only on microhardness and crystallite size, one will expect a reasonable good erosion property from this coating. However, poor erosion performance was observed. Thus, it is believed that other material properties rather than microhardness and crystallite size had a decisive influence on erosion performance of this coating, such as possibly an excess of unreacted zirconium.

Although specific embodiments of this invention have been described, it should be understood that various modifications may be made without departing from the spirit of this invention.

What is claimed is:

1. A homogenous substoichiometric zirconium nitride coating in which the atomic percent of nitrogen in the coating is from about 41 to 48 percent and has a microhardness of greater than 2200 kilograms force per square millimeter when using a 0.1 Kg load.

2. The substoichiometric zirconium nitride coating of claim 1 wherein said zirconium nitride contains from about 42 to about 45 percent.

3. The substoichiometric zirconium nitride coating of claim 1 wherein said zirconium nitride coatings about 43 to 44 atomic percent of nitrogen.

4. The substoichiometric zirconium nitride coating of claim 1 wherein said zirconium nitride coating has a microhardness from 2200 to 2600 kilograms force per square millimeter when using a 0.1 Kg load.

5. The substoichiometric zirconium nitride coating of claim 4 wherein said zirconium nitride coating has a crystallize size measured in the direction perpendicular to (111) diffraction plane of from 12 to 24 nm.

6. The substoichiometric zirconium nitride coating of claim 1 wherein said zirconium nitride coating is from 1 to 40 microns thick.

7. The substoichiometric zirconium nitride coating of claim 6 wherein said zirconium nitride coating is from 1 to 10 microns thick.

8. The substoichiometric zirconium coating of claim 6 wherein said zirconium nitride coating is from 8 to 40 microns.

* * * * *